United States Patent [19]

Momose et al.

[11] Patent Number: 4,991,939

[45] Date of Patent: Feb. 12, 1991

[54] LIQUID CRYSTAL DISPLAY DEVICE

[75] Inventors: Hidehiko Momose, Sakurai; Kohei Kishi; Takayuki Urabe, both of Nara, all of Japan

[73] Assignee: Sharp Kabushiki Kaisha, Osaka, Japan

[21] Appl. No.: 486,359

[22] Filed: Feb. 28, 1990

Related U.S. Application Data

[63] Continuation of Ser. No. 240,672, Sep. 6, 1988.

[30] Foreign Application Priority Data

Oct. 15, 1987 [JP] Japan .............................. 62-260694

[51] Int. Cl.5 ............................................... G02F 1/13
[52] U.S. Cl. .................................... 350/333; 350/336
[58] Field of Search ......................... 350/333, 336, 334

[56] References Cited

U.S. PATENT DOCUMENTS 4,679,909  7/1987  Hamada et al. ...................... 350/333
4,705,358  11/1987 Yamazaki et al. ................... 350/334
4,761,058  8/1988  Okubo et al. ....................... 350/333
4,810,060  3/1989  Ukai ................................... 350/333

FOREIGN PATENT DOCUMENTS 0196915  1/1986  European Pat. Off. .
0209113  7/1986  European Pat. Off. .
2050031  3/1980  United Kingdom .

Primary Examiner—Stanley D. Miller
Assistant Examiner—Huy K. Mai

[57] ABSTRACT

A liquid crystal matrix display device is described which uses, as address devices, thin film transistors each comprising a gate, insulating film, semiconducting film, a source and a drain, and a picture element electrode formed in this order on an insulating substrate. The liquid crystal display device is characterized by source bus line-reinforcing thin film formed under the source bus line of each thin film transistor, on the same plane as the gate.

7 Claims, 6 Drawing Sheets

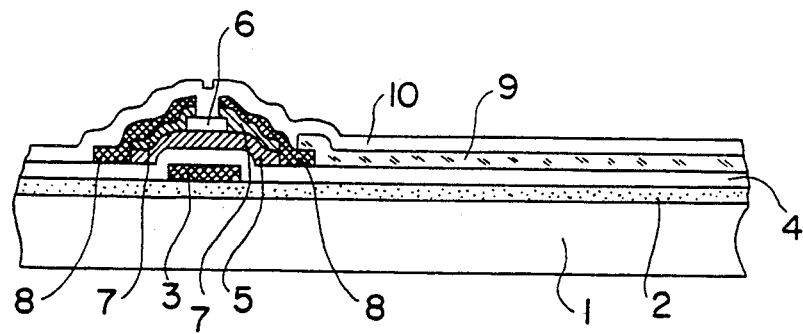
FIG. 4(d)
FIG. 5
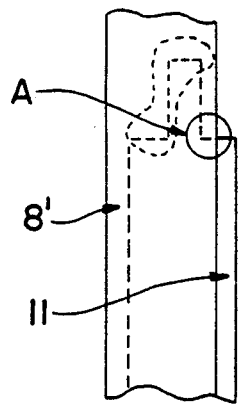
FIG. 6
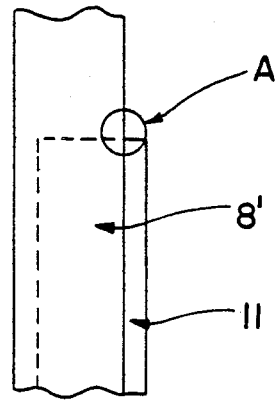

LIQUID CRYSTAL DISPLAY DEVICE

This application is a continuation of copending application Ser. No. 07/240,672, filed on Sept. 6, 1988.

BACKGROUND OF THE INVENTION

The present invention relates to a liquid crystal matrix display device which uses thin film transistors (hereinafter referred to as TFT) as switching devices and particularly to a liquid crystal matrix display panel whose switching devices are reverse stagger type TFT devices using amorphous silicon as semiconductor film.

The typical structure of a liquid crystal matrix display device using reverse stagger type TFT as switching devices is shown in FIGS. 7(a) and 7(b). This liquid crystal display device comprises a gate electrode 103, gate insulation film 104, a-Si film 105, insulation film 106, n+ a-Si film 107, source and drain electrodes 108, a picture element electrode 109 and protective film 110 formed in lamination on an insulating substrate 101. Using glass as the insulating substrate 101 and tantalum (Ta) as the gate electrode 103, when the gate electrode 103 is patterned on the substrate by wet etching, the etchant of the tantalum attacks the glass, resulting in cloudy and/or rough glass surface. No improvement of this point has been proposed.

SUMMARY OF THE INVENTION

In view of the above problem, an object of the present invention is to provide a liquid crystal display device whose substrate surface is not attacked by the etchant.

Another object of the present invention is to provide a liquid crystal matrix display device which uses reverse stagger type TFT as switching elements adn which is virtually free from broken lines.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, according to an embodiment of the present invention, a liquid crystal display device comprises reverse stagger type TFT formed on an insulating substrate, with thin film of the same material as the gate of the TFT, formed flush with the gate and under a source bus line so as to level the source bus line.

According to the present invention, the thin metal film formed simultaneously with the gate helps level the source bus line, thus preventing a broken line.

To achieve the above objects, according to another embodiment of the present invention, a liquid crystal display device comprises reverse stagger type TFT formed on an insulating substrate, and thin film formed flush with the gate of the TFT and under a source bus line to level the source bus line. The thin film further contains, on its each end, a projection superposed under the source bus line. This second embodiment of the invention is characterized in that the thin film for leveling the source bus line also serves as source bus line reinforcement and that a projection superposed under the source bus line is formed on each end of the thin film.

This projection permits the source bus line to overlap the reinforcing thin film in a larger area, thus preventing the source bus line from being broken.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 4(d) is a sectional view of the substrate along the line IIIC—IIIC of FIG. 3;

FIG. 5 shows the end portion of the reinforcing thin film of FIG. 3;

FIG. 6 illustrates deviation in patterning of the reinforcing thin film 11 from the source bus line 8' of FIG. 1;

DETAILED DESCRIPTION OF THE EMBODIMENTS

A liquid crystal display device is described first prior to the description of embodiments of the present invention.

In a liquid crystal color display device, a plurality of transparent electrodes are formed on each of two transparent substrates, and a color filter is provided on either of the two transparent substrates. The two transparent substrates are juxtaposed to each other with a liquid crystal layer therebetween and with the transparent electrodesformed surfaces inside. The entire surface facing the liquid crystal layer, of each transparent substrate is covered with an orientational film. The space between the orientational films is filled with, for example, TN (twisted nematic) liquid crystal. A polarizing plate is provided on the other side of each transparent substrate opposite from the liquid crystal layer. In the liquid crystal display device of the above construction, when voltage is applied to the transparent electrodes, the optical characteristic of the liquid crystal at which voltage is applied changes such that the liquid crystal either transmits or blocks light depending on the direction of the polarizing axis of each polarizing plate. Therefore, color display can be obtained by applying voltage selectively to the transparent electrodes.

In general, the plurality of electrodes on one of the two transparent substrates face and cross those on the other transparent substrate, thus forming picture elements at the intersections. The substrate of the liquid crystal display device of the present invention contains switching devices each of which correspond to each of the picture elements arranged in a matrix.

Figure 1:
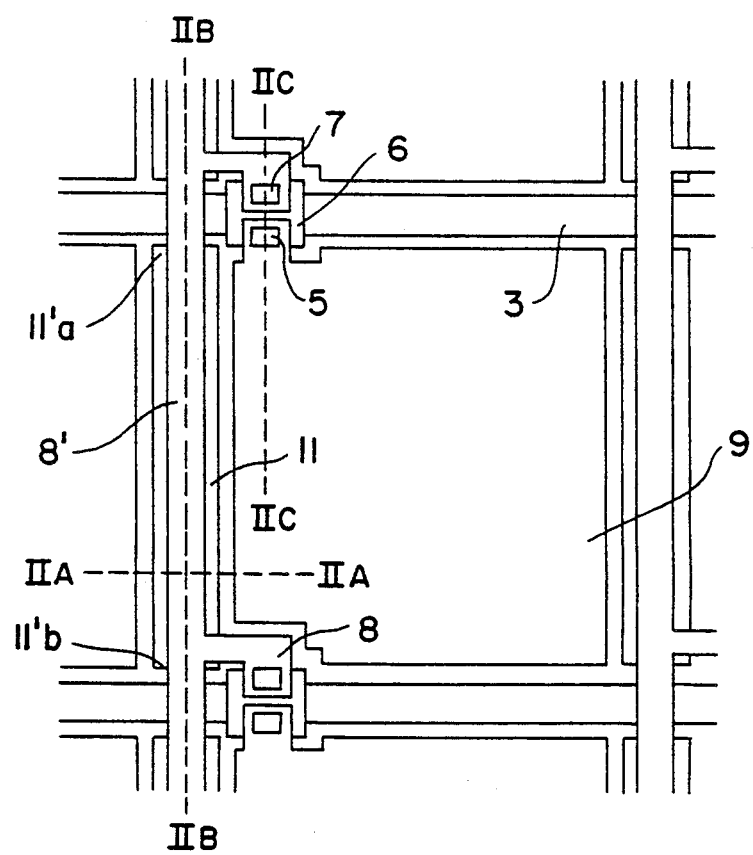
FIG. 1 is a plan view of the substrate of the liquid crystal display device of an embodiment of the present invention.
Figure 2A:
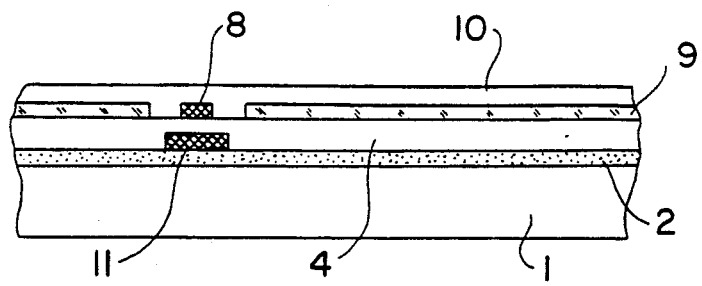
FIG. 2(a) is a sectional view of the substrate along the line IIA—IIA of FIG. 1.
Figure 2B:
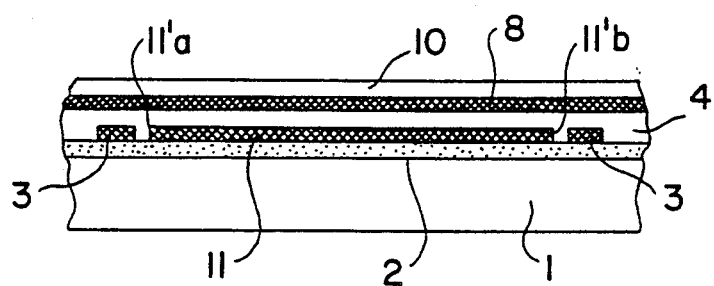
FIG. 2(b) is a sectional view of the substrate along the line IIB—IIB of FIG. 1.
Figure 2C:
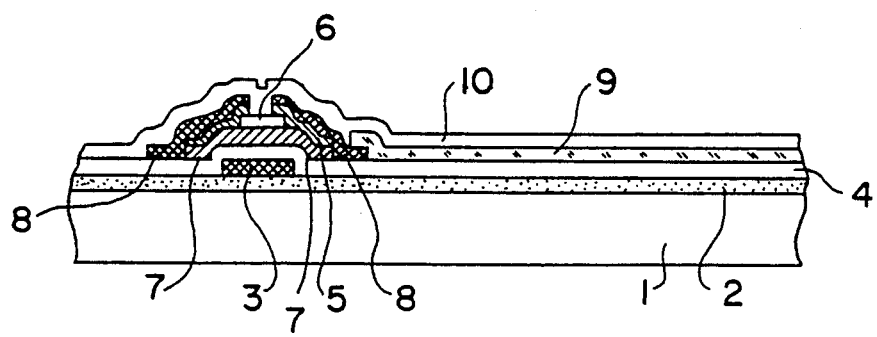
FIG. 2(c) is a sectional view of the substrate along the line IIC—IIC of FIG. 1.

An embodiment of the present invention is described in detail with reference to FIGS. 1, 2(a), 2(b) and 2(c). On an insulating substrate 1 of a glass, is formed an insulating film 2 of tantalum pentoxide ($Ta_2O_5$) about 3000 Å thick, by sputtering. Then tantalum (Ta) film about 3000 Å thick is formed thereon by sputtering and patternized by photo-etching to form a gate electrode 3 and thin metal film 11 on the same plane. Next, an insulating film 4 of SiNx, about 4000 Å thick, is formed thereon by plasma CVD, and a semiconducting layer of amorphous silicon (a-Si) about 300 Å thick is formed. Further, an insulating layer of SiNx about 2000 Å thick is formed thereon. The semiconducting layer and the insulating layer are patternized by photo-etching to form a semiconducting film 5 and an insulating film 6, respectively.

Then, a semiconducting film of n+ amorphous Si (n+ a-Si) about 400 Å thick is formed by plasma CVD and patternized by photo-etching to form a patterned semiconducting film 7. Ti, Mo or W is deposited thereon to a thickness of about 3000 Å by sputtering or electron beam evaporation method. The Ti, Mo or W layer thus formed is patternized by photo-etching to form source and drain electrodes 8. Transparent conducting film composed mainly of indium oxide is then formed to a thickness of about 1000 Å by sputtering or electron beam evaporation method and patternized by photo-etching to form a display picture element electrode 9. Finally, a protective film 10 of SiNx about 5000 Å thick is formed by plasma CVD. In the liquid crystal matrix display device thus obtained, the thin metal film 11 of the same material as the gate electrode 3 is formed on the same plane as the gate electrode 3 under the source bus line 8'. In the present embodiment, the thin metal film 11 is larger in width than the source bus line 8', although the former may be of the same width as the latter.

The thin metal film 11 protects the insulating substrate 1 from being attacked by the etchant, thus minimizing the possibility of a broken source bus line.

In the present embodiment, the TFT which is produced in the above-mentioned process and which serves as a switching address device is provided for each one of the picture elements of the display device. The picture elements are arranged in matrix.

According to the first embodiment, as mentioned above, metal thin film of the same material as the gate electrode is provided under the source bus line, on the same plane as the gate electrode, so as to prevent the insulating substrate from being attacked by the etchant. As a result, a liquid crystal matrix display device free from line breakage is obtained.

In the first embodiment described above, because of the steps 11a and 11b at the ends of the thin film 11 and particularly when the source bus line 8' deviates from the thin film 11 in patterning (as shown in FIG. 6), the source bus line 8' may be broken at the point where the source bus line 8' and the thin film 11 form a step.

Another embodiment of the present invention, to be described in the following eliminates this disadvantage.

Figure 3:
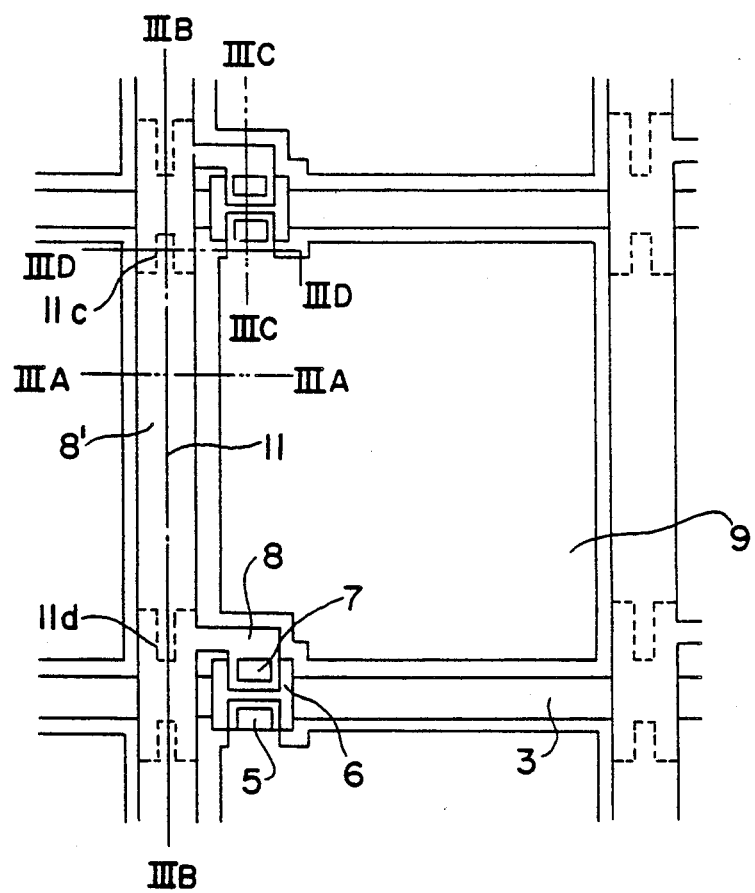
FIG. 3 is a plan view of the substrate of the liquid crystal display device of another embodiment of the present invention.
Figure 4A:
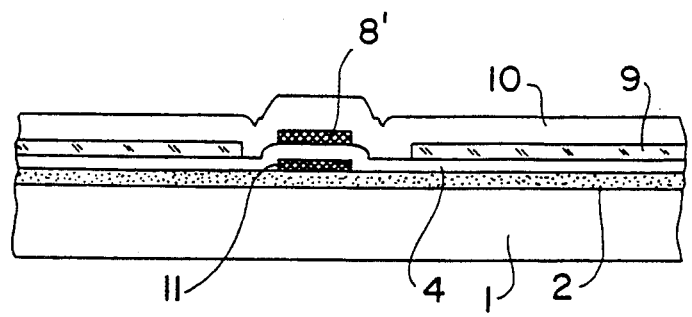
FIG. 4(a) is a sectional view of the substrate along the line IIIA—IIIA of FIG. 3.
Figure 4B:
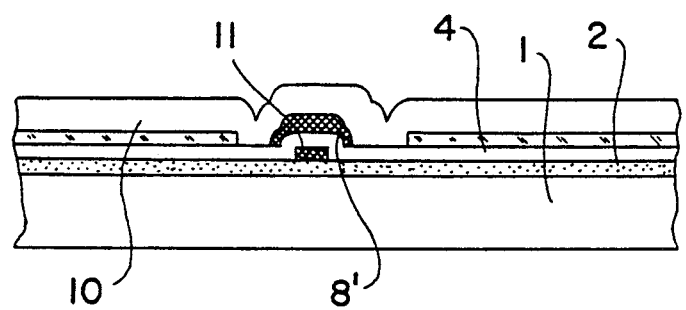
FIG. 4(b) is a sectional view of the substrate along the line IIID—IIID of FIG. 3.
Figure 4C:
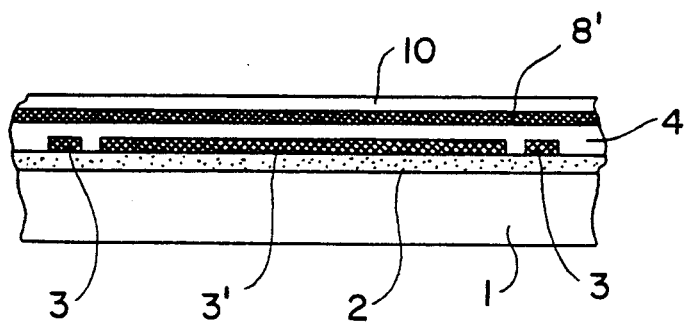
FIG. 4(c) is a sectional view of the substrate along the line IIIB—IIIB of FIG. 3.
Figure 7A:
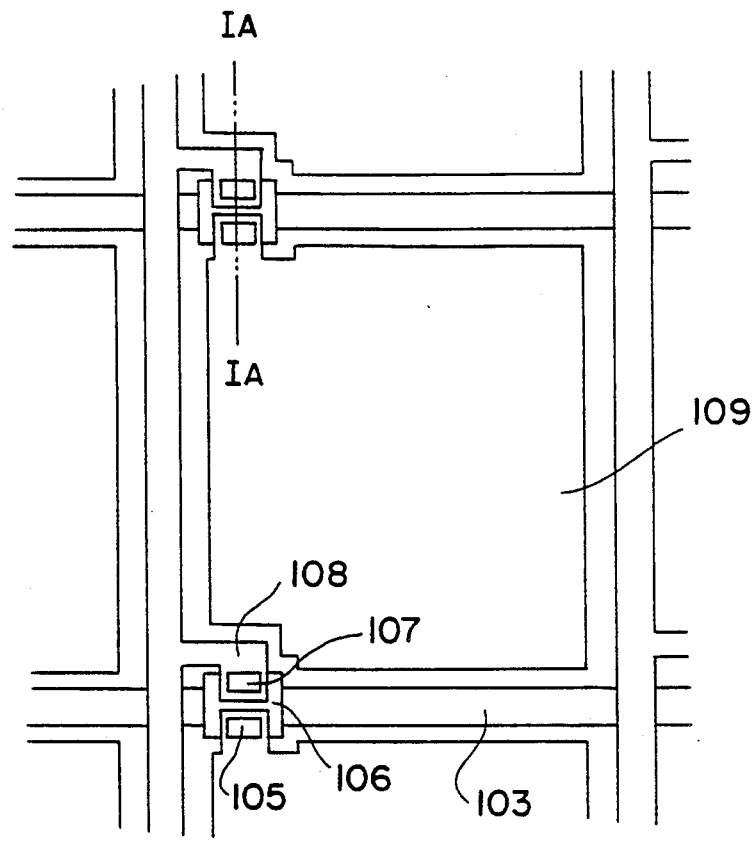
FIG. 7(a) is a plan view of the substrate of the conventional liquid crystal display device.
Figure 7B:
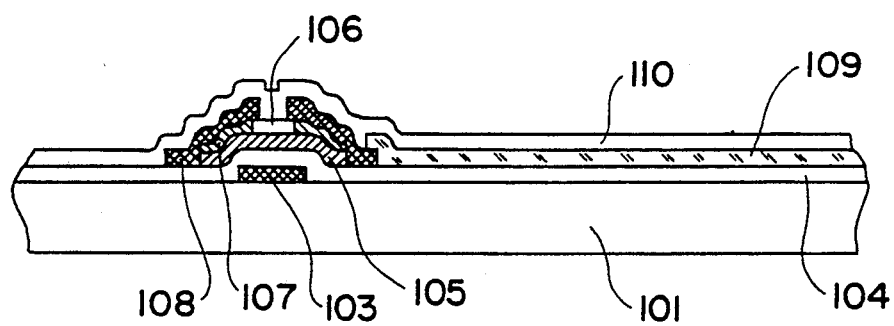
FIG. 7(b) is a sectional view of the substrate along the line IA—IA of FIG. 7(a).

The second embodiment of the present invention is now described in detail with reference to FIGS. 3, 4(a) through 4(d) and 5. FIGS. 4(a) through 4(d) are sectional views of the substrate along the lines IIIA—IIIA, IIID—IIID, IIIB—IIIB and IIIC—IIIC of FIG. 3, respectively. FIG. 5 is an enlarged view of an end of the reinforcing thin film 11.

Insulating film 2 of tantalum pentoxide ($Ta_2O_5$) is formed to a thickness of about 3000 Å, by sputtering, onto an insulatin substrate 1 of a glass. Next, tantalum (Ta) layer about 3000 Å thick is formed by sputtering and patternized by photo-etching to form a gate electrode 3 and source bus line-reinforcing thin film 11 on the same plane. The reinforcing thin film 11 has projections 11a and 11b on both ends. As described above for the first embodiment, the reinforcing thin film 11 also serves to level the source bus line. In the second embodiment, the reinforcing thin film 11 has the same width as the source bus line 8'.

An insulating film 4 of SiNx is then formed to a thickness of about 4000 Å by plasma CVD, and semiconducting layer of amorphous silicon (a-Si) to a thickness of about 300 Å. An insulating layer of SiNx is further formed to a thickness of about 2000 Å. The above semiconducting layer and the insulating layer are patternized by photo-etching to form semiconducting film 5 and insulating film 6 respectively. Next, n+ amorphous silicon (n+ a-Si) semiconducting film about 400 Å thick is formed by plasma CVD, and patternized by photo-etching to form patternized semiconducting film 7.

Ti, Mo or W is deposited thereon to a thickness of about 3000 Å by sputtering or electron beam evaporation method, and patternized by photo-etching to form source and drain electrodes 8 and source bus line 8' simultaneously. Transparent conducting film composed mainly of indium oxide is then formed to a thickness of about 1000 Å by sputtering or electron beam evaporation method, and patternized by photo-etching to form a picture element electrode 9. Finally, a protective film 10 of SiNx is formed to a thickness of 5000 Å by plasma CVD.

In this way, a liquid crystal matrix display panel, whose reinforcing thin film 11 has projections, is obtained.

The reinforcing thin film with projections which is formed under the source bus line prevents the source bus line 8' from being broken when the pattern of the reinforcing thin film 11 deviates from that of the source bus line 8'. As shown in FIG. 5, if the reinforcing thin film 11 deviates from the source bus line 8' in patterning, line breakage would be anticipated in the area "A". According to the second embodiment, however, the reinforcing thin film 11 overlaps in a larger area with the source bus line 8' because of the projection "B" from the reinforcing thin film 11, preventing the breakage of the source bus line 8'.

According to the present invention, as mentioned above, the reinforcing thin film of a rectangular shape formed under the source bus line has projections on both ends thereof, whereby the resulting liquid crystal matrix display device is free from source bus line breakage which might be caused by the pattern deviation of the source bus line from the reinforcing thin film under the source bus line.

While only certain embodiments of the present invention have been described, it will be apparent to those skilled in the art that various changes and modifications may be made therein without departing from the spirit and scope of the present invention as claimed.

What is claimed is:

1. A liquid crystal display device comprising:
   an insulating substrate;
   an insulating film formed on the insulating substrate;
   row and column electrodes formed on the insulating film, said column electrodes having a width;
   thin film transistors formed on the insulating film at intersections of the row and column electrodes, each of said thin film transistors having a gate electrode connected to each of the row electrodes and having source and drain electrodes, one of the source and drain electrodes being connected to the column electrode;
   picture element electrodes formed on the insulating film, each of the picture element electrodes being connected to the other of the source and drain electrodes not connected to the column electrode; and
   thin film layers formed along and under the column electrodes between the row electrodes, each of said thin film layers having a width greater than or equal to said width of the column electrodes to prevent the insulating substrate from being etched, both ends of said thin film layer being terminated by projections having width smaller than said width of the column electrodes.

2. A liquid crystal display device as claimed in claim 1, wherein said projections have a rectangular configuration.

3. A liquid crystal display device as claimed in claim 1, wherein said thin film layers are formed in the same plane as that of the row electrodes.

4. A liquid crystal display device as claimed in claim 1, wherein the row electrodes and the thin film layers are made of the same material.

5. A liquid crystal display device as claimed in claim 1, wherein the row electrodes and the thin film layers are made of tantalum.

6. A liquid crystal display device as claimed in claim 1, wherein the thin film transistors are of reverse stagger type.

7. A liquid crystal display device as claimed in claim 1, wherein the insulating film includes tantalum pentoxide film.

* * * * *